United States Patent [19]
Fairgrieve

[11] Patent Number: 5,493,254
[45] Date of Patent: Feb. 20, 1996

[54] AMPLIFIER INCLUDING CIRCUIT FOR REDUCING INPUT CAPACITANCE

[75] Inventor: Alexander Fairgrieve, Menlo Park, Calif.

[73] Assignee: National Semiconductor Corporation, Santa Clara, Calif.

[21] Appl. No.: 222,213

[22] Filed: Mar. 31, 1994

[51] Int. Cl.$^6$ ............................... H03F 3/45; H03F 1/14
[52] U.S. Cl. ............................. 330/260; 330/292
[58] Field of Search ............................. 330/252, 260, 330/291, 292, 310

[56] References Cited

U.S. PATENT DOCUMENTS

| | | | |
|---|---|---|---|
| 4,418,321 | 11/1983 | Bohme | 330/260 X |
| 4,769,616 | 9/1988 | Barbu | 330/252 |
| 5,091,701 | 2/1992 | Butler | 330/252 |

OTHER PUBLICATIONS

T. Ngo et al., "A Low-Power 3V–5.5V Read/Write Preamplifier for Rigid-Disk Drives", IEEE International Solid-State Circuits Conference, Feb. 18, 1994, pp. 286–287.

Primary Examiner—Steven Mottola
Attorney, Agent, or Firm—Skjerven, Morrill, MacPherson, Franklin & Friel; David E. Steuber

[57] ABSTRACT

The input capacitance of a differential amplifier is reduced by connecting a positive feedback path between the collector of each input transistor and a terminal of a resistor connected in the other parallel current path. The positive feedback paths cause the voltage at the collector of each input transistor to move in the same direction as the voltage at the base of that input transistor, and thereby reduce the effective input capacitance seen at the input terminals of the differential amplifier.

12 Claims, 4 Drawing Sheets

AMPLIFIER INCLUDING CIRCUIT FOR REDUCING INPUT CAPACITANCE

FIELD OF THE INVENTION

This invention relates to differential amplifiers and, in particular, circuitry for reducing the input capacitance of a differential amplifier.

BACKGROUND OF THE INVENTION

Amplifiers or preamplifiers which contain a differential pair of transistors are commonly used as input stages for amplifier circuits, particularly when low noise and input offset are required. To minimize the noise and input offset, large transistors are preferable, but this has the undesirable consequence of increasing the input capacitance of the amplifier.

Differential amplifiers suffer particularly from Miller capacitance, which arises from the fact that the base (input) and collector terminals of the input transistors are pulled in opposite directions by the increased voltage drop across the load as the current through the transistor is varied. That is, the voltage at the collector terminal decreases as the voltage at the base terminal increases, and the voltage at the collector terminal increases as the voltage at the base terminal decreases.

The conventional solution to this problem has been to connect a pair of cascode transistors between the input transistors and the load resistors. While this reduces the effective input capacitance to a value equal to twice the capacitance of the collector/base junction of the input transistor, this level is still too high for certain applications. For example, a lower input capacitance is desirable in a preamplifier used in disk drives. In this application, the dual objectives of low noise and low input capacitance are in direct conflict.

A solution to this problem is very much needed, particularly one that has a simple structure and consumes a minimum of power.

SUMMARY OF THE INVENTION

A differential amplifier in accordance with this invention includes a pair of input transistors, a pair of load elements, and a pair of cascode transistors. Each input transistor, load element and cascode transistor is connected in a separate current or "gain" path, and the two current paths are connected in parallel and supplied by a current source. In addition, a positive feedback path is connected between the collector of each input transistor and a point on the opposite current path which moves in the same direction (voltage wise) as an input voltage applied to the base terminal of the input transistor. This reduces the effective input capacitance by causing the voltages at the base and collector terminals of each input capacitor to move in the same direction. The amount of positive feedback may be varied to cause the voltages at the base and collector terminals to track each other, for example, or even to cause the voltage at the collector to move more rapidly than the voltage at the base, thereby providing "negative" capacitance and canceling out some of the emitter-base capacitance of the input transistor.

In a preferred embodiment, a resistor and an additional transistor are connected in each current path between the emitter terminal of the cascode transistor and the collector terminal of the input transistor. The positive feedback path extends from a node between this resistor and additional transistor and through the base-emitter junction of the additional transistor in the other current path to the collector of the input transistor in the other path.

In an alternative embodiment, the cascode transistors are omitted, and the resistors are connected at respective ends of the current paths. The positive feedback paths are connected between a terminal of each resistor and the base of the additional transistor in the other current path.

The amplifier of this invention allows the input capacitance to be reduced to any desired level and is particularly suitable for use in disk drives.

DESCRIPTION OF THE INVENTION

Figure 1:
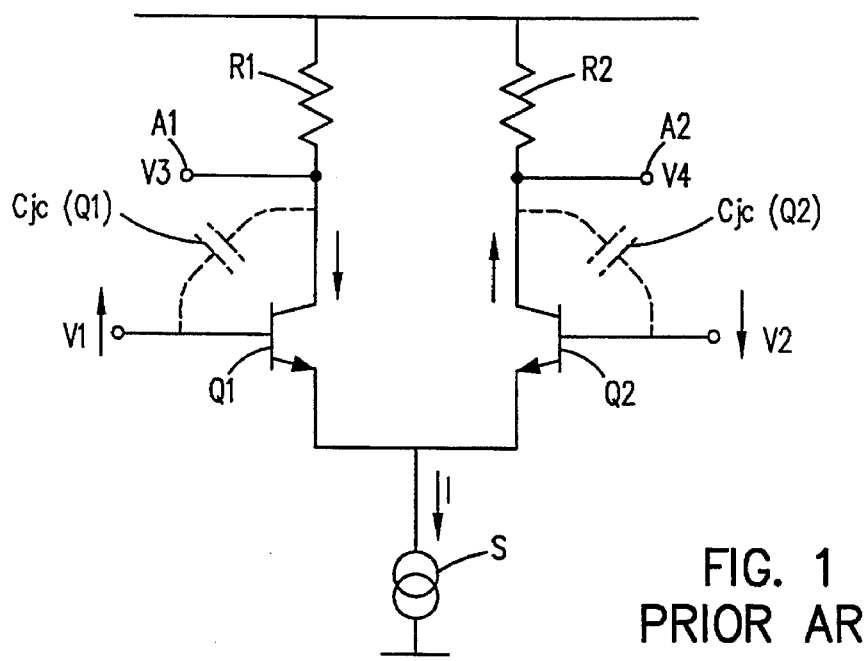
FIG. 1 illustrates a simplified circuit diagram of a prior art differential amplifier.

The general problem of input capacitance in differential amplifiers is illustrated by the simplified circuit shown in FIG. 1. Amplifier 10 includes input transistors Q1 and Q2 and load resistors R1 and R2, which are connected in respective current paths supplied by a current source S, which provides a current I. Differential input voltages V1 and V2 are applied to the base terminals of transistors Q1 and Q2 and differential output voltages V3 and V4 are produced at output terminals A1 and A2. The collector-base capacitance of transistors Q1 and Q2 are represented in phantom as $C_{jc}(Q1)$ and $C_{jc}(Q2)$, respectively.

As indicated by the arrows, as the input voltage V1 is increased, a greater portion of the current I passes through load resistor R1, and the voltage at the collector of transistor Q1 falls. This in turn increases the effective capacitance $(C_{eff})$ seen at the base terminal of transistor Q1. It is known that the value of $C_{eff}$ is related to the gain (A) by the following function.

$$C_{eff} = C_{jc}(Q1)(1+A)$$

This is known as the Miller capacitance, and it will be apparent that the same effective input capacitance is seen at the base terminal of transistor Q2.

Figure 2:
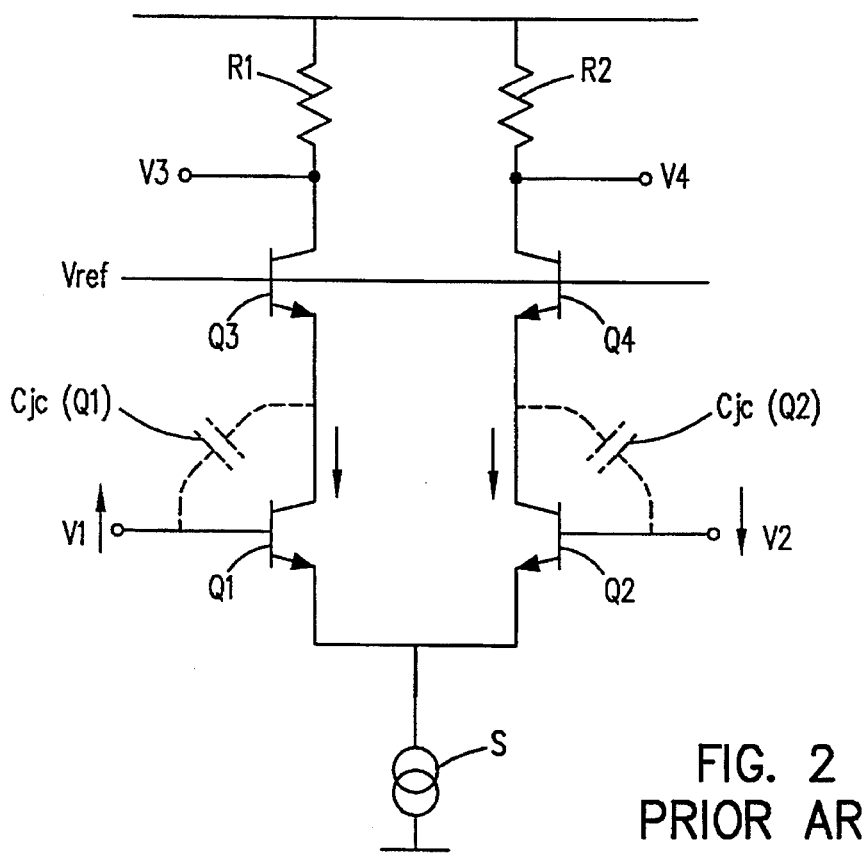
FIG. 2 illustrates a circuit diagram of a prior art differential amplifier which contains cascode transistors.

A known technique for reducing the Miller capacitance is illustrated in FIG. 2, wherein an amplifier 20 includes a pair of cascode transistors Q3 and Q4 which have been connected in the parallel current paths, respectively. The base terminals of transistors Q3 and Q4 are fixed to a reference voltage $V_{ref}$ which is generally less than V3 or V4.

For amplifier 20 in FIG. 2, the gain at the collector terminals of transistors Q1 and Q2 is reduced to 1, and therefore, the effective capacitance at either input terminal is expressed as follows.

$$C_{eff} = C_{jc}(1+1)$$

While this is a significant improvement over the embodiment shown in FIG. 1, it still does not meet the requirements of many applications, including in particular the amplifiers used in disk drives.

Figure 3:
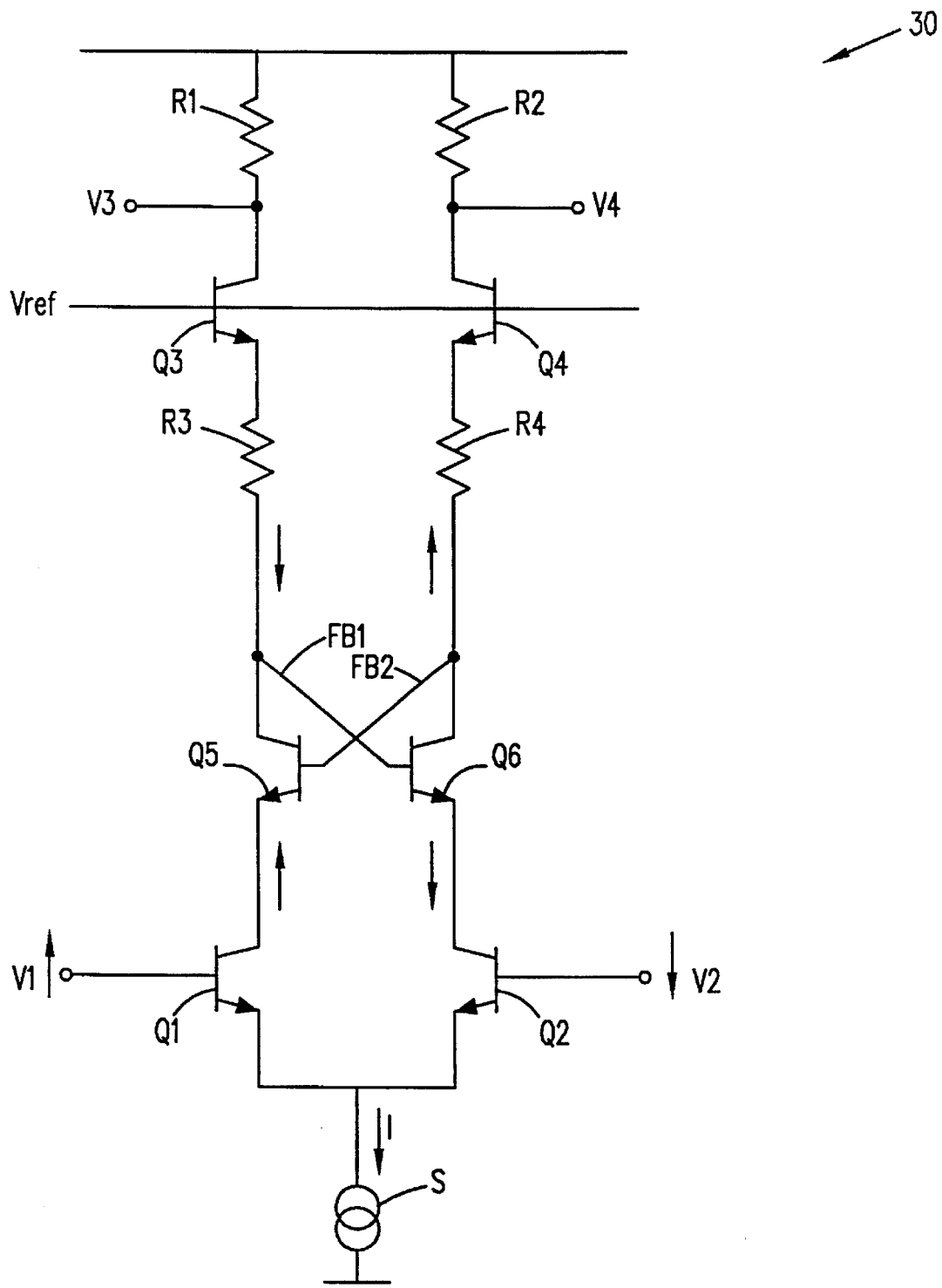
FIG. 3 illustrates a circuit diagram of a preferred embodiment of a differential amplifier according to the invention.

The effective input capacitance is significantly reduced in a preferred embodiment according to this invention, which is illustrated in FIG. 3. Amplifier 30 shown in FIG. 3 includes a pair of resistors R3 and R4 and a pair of transistors Q5 and Q6. As shown, resistor R3 and transistor Q5 are connected in one of the parallel current paths between transistor Q3 and transistor Q1. Resistor R4 and transistor Q6 are connected in the other parallel current path between transistor Q4 and transistor Q2. A positive feedback path FB1 is connected from the common node between resistor R3 and transistor Q5 to the base terminal of transistor Q6. A second positive feedback path FB2 is connected from the common node between resistor R4 and transistor Q6 to the base terminal of transistor Q5.

The operation of amplifier 30 can be described as follows. As the input voltage V1 increases, a portion of the current I is shifted from transistor Q2 to transistor Q1. With less current flowing through transistor Q2 and the other elements in that current path, the voltage at the emitter of transistor Q4 increases. This voltage increase is effectively amplified by resistor R4 and delivered to the base terminal of transistor Q5. Since transistor Q5 operates as an emitter follower, the voltage at the collector of transistor Q1 rises. Thus, the voltages at both the base and collector terminals of transistor Q1 rise at the same time, thereby reducing the effective input capacitance seen at the base terminal of transistor Q1.

The converse happens at transistor Q2. With a greater share of the current I flowing through transistor Q1, the voltage at the emitter terminal of transistor Q3 falls, and this is effectively amplified by resistor R3 and delivered to the base of transistor Q6. Like transistor Q5, transistor Q6 functions as an emitter follower, and therefore the voltage at the collector of transistor Q2 falls.

By causing the voltage at the collector and base terminals of each of transistors Q1 and Q2 to move in the same direction, the input capacitance is effectively "canceled". The degree of the cancellation is determined by the size of resistors R3 and R4. Assuming that the circuit is balanced and that R3=R4, the effective input capacitance can be expressed as follows.

$$C_{eff} = C_{jc}(1 - R_4/R_e)$$

where $R_4$=the value of resistor R4

$R_e = V_T/I_E$ and where $I_E = I/2$ $V_T = KT/q \cong 26$ mv (at room temperature)

k being Boltzman's constant, T being the ambient temperature (in degrees Kelvin), and q being the charge of an electron.

Thus, if $R_4$ is made to equal $R_e$, the effective input capacitance is zero. If $R_4$ is made to be greater than $R_e$, then a negative input capacitance is provided, and a portion of the base-emitter capacitance of transistors Q1 and Q2 will be canceled out. In fact, by increasing $R_4$ to an appropriate level, all of the base-collector and base-emitter capacitance of transistors Q1 and Q2 can be canceled.

Figure 4:
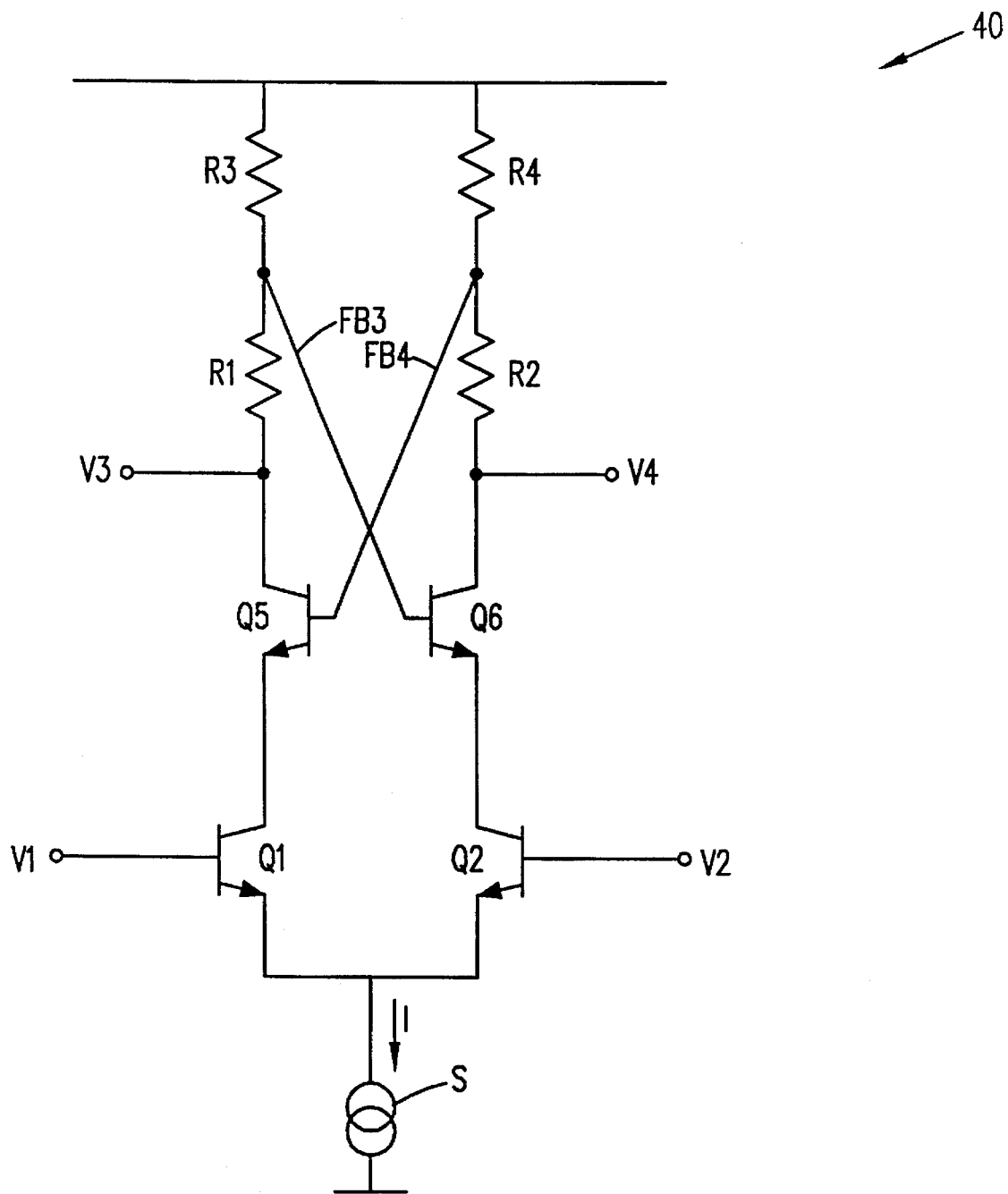
FIG. 4 illustrates a circuit diagram of an alternative embodiment in which emitter-follower transistors are supplied by separate current sources and are included in the feedback path.

An alternative embodiment is illustrated in FIG. 4. In amplifier 40 transistors Q3 and Q4 have been omitted, and resistors R3 and R4 have been connected at the ends of their respective current paths. A feedback path FB3 extends from a common node between resistors R1 and R3 to the base terminal of transistor Q6; and a feedback path FB4 extends from a common node between resistors R2 and R4 to the base terminal of transistor Q5. As the input voltage V1 increases, a greater share of the current I is shifted to transistor Q1 from transistor Q2, and the voltage in feedback path FB4 therefore increases. Transistor Q5 operates as an emitter-follower and delivers the input voltage to the collector of transistor Q1. Conversely, the voltage in feedback path FB3 falls, and this reduced voltage is delivered via emitter-follower transistor Q6 to the collector of transistor Q2.

Figure 5:
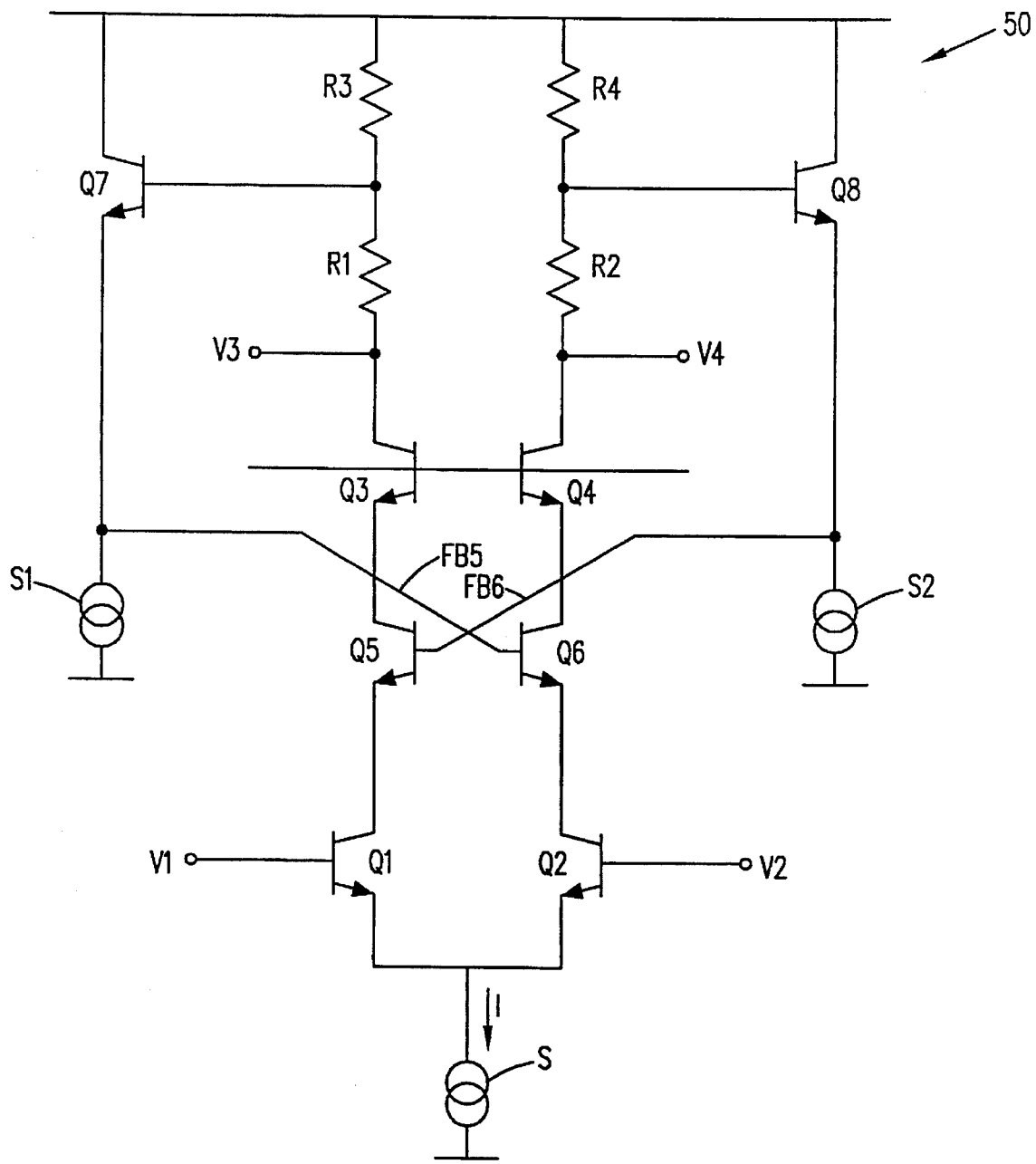
FIG. 5 illustrates a circuit diagram of another alternative embodiment in which the cascode transistors are omitted.

FIG. 5 illustrates a third embodiment according to the invention. In amplifier 50, resistors R3 and R4 remain connected as shown in FIG. 4, and transistors Q3 and Q4 are reintroduced. Amplifier 50 further includes an emitter-follower transistor Q7 connected to a current source S1, and an emitter-follower transistor Q8 connected to a current source S2. The base terminal of transistor Q7 is connected to a common node between resistor R1 and resistor R3, and the base terminal of transistor Q8 is connected to a common node between resistor R2 and resistor R4. The emitter terminal of transistor Q7 is connected via a feedback path FB5 to the base terminal of transistor Q6, and the emitter terminal of transistor Q8 is connected via a feedback path FB6 to the base terminal of transistor Q5.

As the input voltage V1 increases, the voltage at the base terminal of transistor Q8 also increases, and this is delivered via feedback path FB6 to the base terminal of transistor Q5. Since transistor Q5 operates as an emitter-follower, the voltage at the collector of transistor Q1 also increases. At the same time, the voltage at the base terminal of transistor Q7 falls, and this is delivered via feedback path FB5 to the base terminal of transistor Q6. Since transistor Q6 operates as an emitter-follower, this reduced voltage is delivered to the collector terminal of transistor Q2.

While several particular embodiments according to this invention have been described, numerous alternative and additional embodiments within the broad principles of this invention will be apparent to those skilled in the art. This invention, as defined in the following claims, is intended to include all such additional and alternative embodiments.

I claim:

1. A differential amplifier comprising:

a first current path including a first input transistor, a first cascode transistor and a first resistor, said first resistor being connected between said first cascode transistor and said first input transistor;

a second current path including a second input transistor, a second cascode transistor and a second resistor, said second resistor being connected between said second cascode transistor and said second input transistor;

a first feedback path extending between a terminal of said first resistor and a collector terminal of said second input transistor; and a second feedback path extending between a terminal of said second resistor and a collector terminal of said first input transistor.

2. The differential amplifier of claim 1 wherein said first feedback path includes a first emitter-follower transistor and said second feedback path includes a second emitter-follower transistor.

3. The differential amplifier of claim 2 wherein said first emitter-follower transistor is connected in said second current path and said second emitter-follower transistor is connected in said first current path.

4. The differential amplifier of claim 3 further comprising a pair of input terminals connected to the respective base terminals of said first input transistors and a pair of output terminals connected to respective collector terminals of said first and second cascode transistors.

5. A differential amplifier comprising:

a first current path including a first input transistor, a first cascode transistor, a first load element and a first resistor, said first load element being connected between said first resistor and said first cascode transistor;

a second current path including a second input transistor, a second cascode transistor, a second load element and a second resistor, said second load element being connected between said second resistor and said second cascode transistor;

a first feedback path extending between a terminal of said first resistor and a collector terminal of said second input transistor; and a second feedback path extending between a terminal of said second resistor and a collector terminal of said first input transistor.

6. The differential amplifier of claim 5 wherein said first feedback path includes a first emitter-follower transistor, said first emitter-follower transistor being connected to a first current source, and wherein said second feedback path includes a second emitter-follower transistor, said second emitter-follower transistor being connected to a second current source.

7. A differential amplifier comprising:

a first current path, said first current path comprising a first input transistor, a first emitter-follower transistor, a first load element and a first resistor, said first load element being connected between said first resistor and said first emitter-follower transistor;

a second current path, said second current path comprising a second input transistor, a second emitter-follower transistor, a second load element and a second resistor, said second load element being connected between said second resistor and said second emitter-follower transistor;

a first feedback path extending between a terminal of said first resistor and a base terminal of said second emitter-follower transistor, said first feedback path equalizing the voltage at said terminal of said first resistor and said base terminal of said second emitter-follower transistor; and a second feedback path extending between a terminal of said second resistor and a base terminal of said first emitter-follower transistor, said second feedback path equalizing the voltage at said terminal of said second resistor and said base terminal of said first emitter-follower transistor.

8. The differential amplifier of claim 7 further comprising a pair of input terminals connected to the respective base terminals of said input transistors.

9. A differential amplifier comprising:

a first current path including a first input transistor, said first input transistor having a base terminal for receiving a first differential input voltage;

a second current path including a second input transistor, said second input transistor having a base terminal for receiving a second differential input voltage;

a first feedback path extending between a first node and a collector terminal of said first input transistor; and a second feedback path extending between a second node and a collector terminal of said second input transistor;

wherein said amplifier is configured such that a voltage at said first node and a voltage at said collector terminal of said first input transistor increase when said first differential input voltage increases relative to said second differential input voltage and decrease when said first differential input voltage decreases relative to said second differential input voltage and such that a voltage at said second node and a voltage at said collector terminal of said second input transistor increase when said second differential input voltage increases relative to said first differential input voltage and decrease when said second differential input voltage decreases relative to said first differential input voltage.

10. The differential amplifier of claim 9 wherein said first node is located in said second current path and said second node is located in said first current path.

11. The differential amplifier of claims 9 or 10 wherein said first feedback path includes a portion of said first current path and said second feedback path includes a portion of said second current path.

12. A method of reducing the input capacitance of a differential amplifier, said differential amplifier comprising first and second input transistors, a first differential input voltage being applied to a base terminal of said first input transistor and a second differential input voltage being applied to a base terminal of said second input transistor, said method comprising causing a voltage at a collector terminal of said first input transistor to move in the same direction as said first differential input voltage and causing a voltage at a collector terminal of said second input transistor to move in the same direction as said second differential input voltage.

* * * * *